US012689384B2

(12) United States Patent
Mocchiutti et al.

(10) Patent No.: US 12,689,384 B2
(45) Date of Patent: Jul. 21, 2026

(54) METHOD AND SYSTEM FOR BUFFERING A REFERENCE VOLTAGE

(71) Applicant: Infineon Technologies AG, Neubiberg (DE)

(72) Inventors: Giulia Mocchiutti, Villach (AT); Enrico Caruso, Villach (AT)

(73) Assignee: Infineon Technologies AG, Neubiberg (DE)

( * ) Notice: Subject to any disclaimer, the term of this patent is extended or adjusted under 35 U.S.C. 154(b) by 159 days.

(21) Appl. No.: 18/592,754

(22) Filed: Mar. 1, 2024

(65) Prior Publication Data

US 2025/0279721 A1 Sep. 4, 2025

(51) Int. Cl.
G05F 1/56 (2006.01)
H03M 1/06 (2006.01)

(52) U.S. Cl.
CPC .............. H03M 1/06 (2013.01); G05F 1/561 (2013.01)

(58) Field of Classification Search
CPC ............. G05F 1/461; G05F 1/575; G05F 1/56
See application file for complete search history.

(56) References Cited

U.S. PATENT DOCUMENTS 9,019,140 B2 * 4/2015 Zhao ........................ H03M 1/06
341/172

OTHER PUBLICATIONS

Chang, Dong-Jin, et al., "Normalized-Full-Scale-Referencing Digital-Domain Linearity Calibration for SAR ADC", IEEE Transactions on Circuits and Systems I: Regular Papers, Feb. 2017, 64.2: 322-332.

De Matteis, Marcello et al., "A Biquadratic Cell Based on the Flipped-Source-Follower Circuit", IEEE Transactions on Circuits and Systems II: Express Briefs, vol. 64, No. 8, Aug. 2016, pp. 867-871.

Gholami, Babak "Design and Simulation of a Low-Voltage Low-Offset Operational Amplifier", (IJACSA) International Journal of Advanced Computer Science and Applications, vol. 7, No. 1, Jan. 2016, pp. 337-339.

Harikumar, Prakash et al., "Design of a reference voltage buffer for a 10-bit 50 MS/s SAR ADC in 65 nm CMOS", IEEE International Symposium on Circuits and Systems (ISCAS), May 24-27, 2015, pp. 249-252.

(Continued)

*Primary Examiner* — Peter M Novak
(74) *Attorney, Agent, or Firm* — Slater Matsil, LLP

(57) ABSTRACT

In accordance with an embodiment, a circuit includes an amplifier comprising a first input coupled to a reference voltage node, a first buffer having an input coupled to an output of the amplifier, a second buffer having an input coupled to the output of the amplifier, and a capacitor. A method of operating the circuit includes during a first phase of operation: forming a first closed loop including the amplifier and the first buffer and excluding the capacitor and the second buffer, and sampling a voltage difference between an output of the second buffer and the reference voltage node across the capacitor; and during a second phase of operation, forming a second closed loop including the amplifier, the first buffer, and the capacitor with the sampled voltage difference stored thereon, and excluding the second buffer.

20 Claims, 4 Drawing Sheets

(56) References Cited

OTHER PUBLICATIONS

Lee, Chang-kyo et al., "A Replica-Driving Technique for High Performance SC Circuits and Pipelined ADC Design", IEEE Transactions on Circuits and Systems II: Express Briefs, Sep. 2013, vol. 60, No. 9, pp. 557-561.
Makinwa, Kofi, "Dynamic Offset-Cancellation Techniques", Smart Sensor Systems, Tudelft, Delft, The Netherlands, Jan. 2002, 42 pages.

* cited by examiner

300

302

METHOD AND SYSTEM FOR BUFFERING A REFERENCE VOLTAGE

TECHNICAL FIELD

The present invention relates generally to electronic systems and methods, and, in particular embodiments, to a method and system for a reference buffer.

BACKGROUND

Electronic systems often require the conversion of signals from analog to digital form and vice versa. Analog signals represent information in a continuous range of values, whereas digital signals represent information in discrete or quantized steps. Analog-to-digital converters (ADCs) are used to transform continuous analog signals into a digital representation, allowing for signal processing, storage, and transport in digital systems. Conversely, digital-to-analog converters (DACs) take digital data and reconstruct the original analog signal for use in applications such as audio playback, control systems, and communication devices.

Both ADCs and DACs are fundamental components in numerous electronic devices and systems, including computers, smartphones, medical equipment, instrumentation, and industrial control systems. To ensure accurate and reliable operation of these converters, reference voltages play an important role.

Reference voltages are used by ADCs and DACs as a benchmark to compare against input signals during the conversion process. The quality of these reference voltages may directly influence the accuracy and linearity of the conversion process. In some cases, offset and noise within the reference voltage may manifest as errors in the digital or reconstructed analog signal.

In ADCs, the reference voltage often defines the maximum input voltage range that can be digitized. Each step of digital value (quantization level) corresponds to a specific fraction of the reference voltage. Similarly, in DACs, the reference voltage may determine the output voltage range over which the digital input is translated into an analog signal. For both ADCs and DACs, low-noise design techniques, shielding, buffering, and filtering strategies are often employed to protect the integrity of the reference voltage.

SUMMARY

In accordance with an embodiment, a circuit includes an amplifier comprising a first input coupled to a reference voltage node, a first buffer having an input coupled to an output of the amplifier, a second buffer having an input coupled to the output of the amplifier, and a capacitor. A method of operating the circuit includes during a first phase of operation: forming a first closed loop including the amplifier and the first buffer and excluding the capacitor and the second buffer, and sampling a voltage difference between an output of the second buffer and the reference voltage node across the capacitor; and during a second phase of operation, forming a second closed loop including the amplifier, the first buffer, and the capacitor with the sampled voltage difference stored thereon, and excluding the second buffer.

In accordance with another embodiment, a circuit includes: an amplifier comprising a first input coupled to a reference voltage node; a first buffer having an input coupled to an output of the amplifier; a second buffer having an input coupled to the output of the amplifier; a capacitor; and a controller configured to: during a first phase of operation:

form a first closed loop including the amplifier and the first buffer and excluding the capacitor and the second buffer, and sample a voltage difference between an output of the second buffer and the reference voltage node across the capacitor; and during a second phase of operation, form a second closed loop including the amplifier, the first buffer, and the capacitor with the sampled voltage difference stored thereon, and excluding the second buffer.

In accordance with a further embodiment, a circuit includes: an amplifier having a first input coupled to a reference voltage node and a second input; a first buffer having an input coupled to an output of the amplifier; a second buffer having an input coupled to the output of the amplifier; a capacitor; a first switch coupled between an output of the first buffer and the second input of the amplifier; a second switch coupled between the first input of the amplifier and a first terminal of the capacitor; a third switch coupled between an output of the second buffer and a second terminal of the capacitor; a fourth switch coupled between the second input of the amplifier and the second terminal of the capacitor; and a fifth switch coupled between the output of the first buffer and the first terminal of the amplifier.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In an embodiment, a reference voltage buffer circuit includes an amplifier with its output coupled to both an output buffer and a replica buffer, with the replica buffer intended for connection to an external load. The system operates in two distinct phases. In the first phase, the circuit captures the offset voltage that exists between the differential amplifier's first input terminal and the output of the replica buffer, storing this value on a dedicated capacitor. Subsequently, in the second phase, an offset correction feedback loop is established that includes the amplifier, the capacitor, and the output buffer. The purpose of this loop is to adjust the voltage at the second input terminal of the amplifier by subtracting the previously stored offset voltage from it. Concurrently, during this phase, the replica buffer actively delivers a replica of the voltage present at the differential amplifier's first input terminal.

Because the replica buffer operates in an open loop configuration during the second phase, the bandwidth of the replica buffer is not limited by the loop bandwidth of the offset correction feedback loop. Thus, the replica buffer can advantageously provide a buffered voltage that is stable over a large bandwidth with high phase margins even when driving capacitive loads in some embodiments. Moreover, even though the replica buffer is not a part of the offset correction feedback loop during the second phase, the replica buffer is advantageously able to provide a very low offset signal due to its offset being stored on the capacitor.

In some embodiments, the output buffer and/or amplifier may be biased at a lower current than the replica buffer in order to save power. In some embodiments, the reference voltage buffer is configured to buffer a reference voltage for an analog-to-digital converter.

Figure 1:
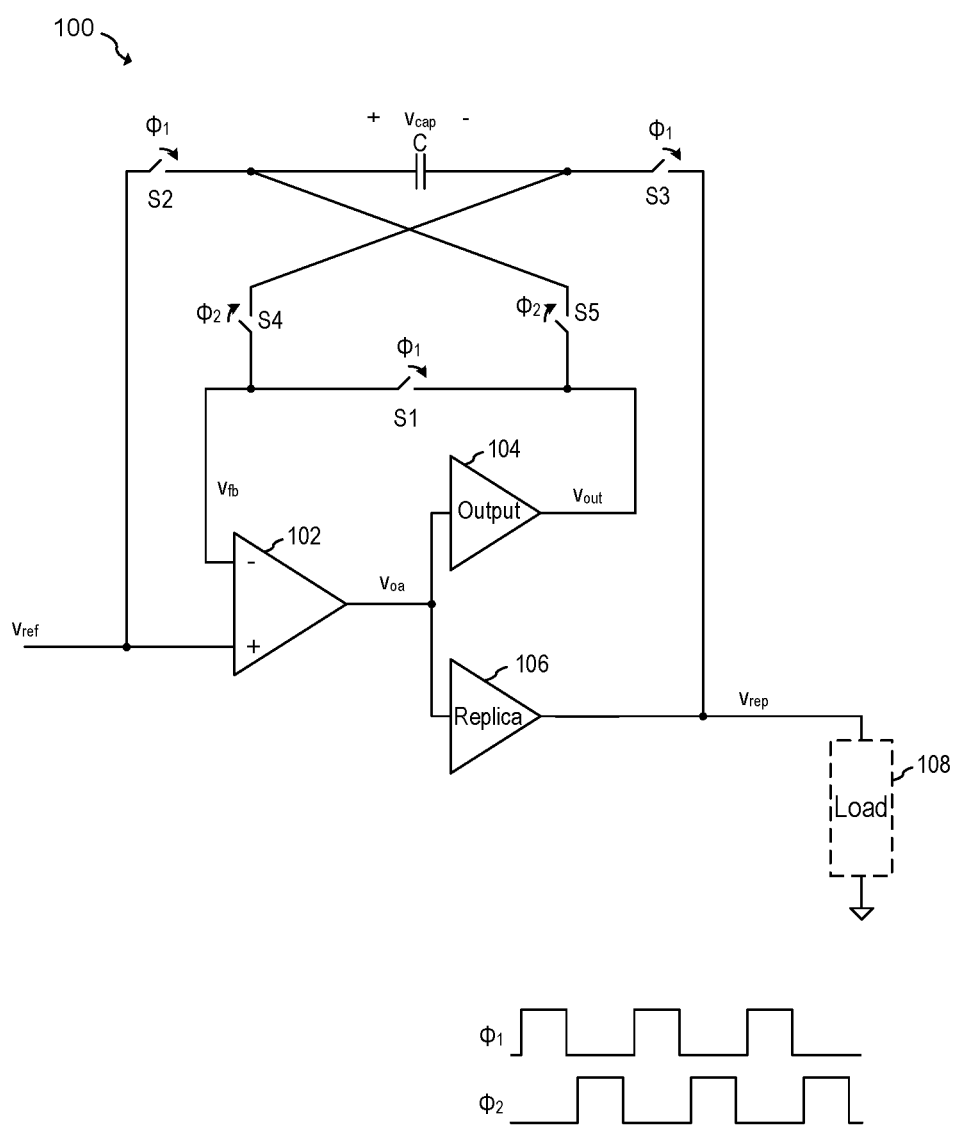
FIG. 1 illustrates a reference buffer circuit according to an embodiment.

FIG. 1 illustrates reference voltage buffer circuit 100 according to an embodiment of the present invention. As shown, reference voltage buffer circuit 100 includes an amplifier 102, an output buffer 104, a replica buffer 106, a set of switches S1, S2, S3, S4, and S5, and a capacitor C. The amplifier 102 has a first input coupled to a reference voltage node, and the output buffer 104 and the replica buffer 106 each have an input coupled to an output of the amplifier 102. The replica buffer 106 provides the voltage $V_{rep}$ to a load, while the output buffer 104 generates a voltage $V_{out}$. The switches S1 through S5 are arranged to facilitate a dynamic offset cancellation process during different phases of operation, as indicated by the timing diagrams for phases $\phi_1$ and $\phi_2$. The capacitor C is used to sample and store the offset error during the first phase $\phi_1$ of operation and to subtract this error from the input during the second phase $\phi_2$ of operation, thereby correcting for the intrinsic offset of the reference voltage buffer circuit 100.

FIG. 1 also illustrates a timing diagram showing the relationship between the first phase $\phi_1$ and second phase $\phi_2$ of operation. In some embodiments the first phase $\phi_1$ and second phase $\phi_2$ are controlled using non-overlapping clock signals to prevent loss of stored charge from capacitor C. These clock signals may be generated, for example, using a controller (not shown) configured to generate the non-overlapping clock signals. The controller may be implemented using, for example, non-overlapping clock generation circuits known in the art, using, for example, cross-coupled logic gates. The controller may also be implemented using other types of hardware and/or a combination of hardware, software or firmware. For example, in some embodiments, the controller may be implemented using a processor configured to execute software or firmware instructions stored in memory.

During the first phase $\phi_1$ of operation switch S1 is closed (also referred to as activated), which couples the output of output buffer 104 to the negative input (also referred to as the second input) of amplifier 102. This essentially places amplifier 102 in a unity gain configuration. Switches S2 and S3 are also closed during the first phase of operation, which couples capacitor C between the output of replica buffer 106 and the positive input (also referred to as the first input) of amplifier 102 at reference voltage input node Vref. Hence, during the first phase $\phi_1$ of operation, a closed loop is formed that includes amplifier 102 and output buffer 104 (also referred to as a first buffer), and excludes capacitor C and replica buffer 106 (also referred to as a second buffer).

During the first phase of operation, the output voltage $\upsilon_{rep}$ of replica buffer 106 is:

$$v_{rep} = v_{ref} + v_{off} + v_{mis},$$

where $\upsilon_{ref}$ is the voltage at the positive input of amplifier 102, Voff is the intrinsic offset of amplifier 102, and $v_{mis}$ is the mismatch between output buffer 104 and replica buffer 106. Accordingly, the voltage across capacitor C is:

$$v_{cap} = v_{ref} - v_{rep}.$$

During the second phase $\phi_2$ of operation, switches S4 and S5 are closed and switches S1, S2 and S3 are opened (also referred to as deactivated). This essentially reverses the polarity of capacitor C, and forms a closed loop that includes amplifier 102, output buffer 104 and capacitor C connected between the output of output buffer 104 and the negative input of amplifier 102. Replica buffer continues to provide voltage $v_{rep}$ to load 108, but remains outside of the closed loop. Hence, during the second phase $\phi_2$ of operation a closed loop is formed that includes amplifier 102, output buffer 104, and capacitor C with voltage $v_{cap}$ stored thereon, and excludes replica buffer 106. While capacitor C is shown coupled between the output of output amplifier 104 and the input of amplifier 102 in FIG. 1, it should be understood that in alternative embodiments, capacitor C may be coupled in other positions within the closed loop. For example, capacitor C may be coupled between the output of amplifier 102 and the input of output 104 during the second phase $\phi_2$ of operation.

During the second phase the replica output is:

$$
\begin{aligned}
V_{rep2} &= v_{ref} + v_{off} + v_{mis} + v_{cap} \\
&= v_{ref} + v_{off} + v_{mis} + v_{ref} - v_{rep1} \\
&= v_{ref} + v_{off} + v_{mis} + v_{ref} - v_{ref} - v_{off} - v_{mis} \\
&= v_{ref}.
\end{aligned}
$$

As seen by the expressions above, embodiments of the present invention may provide compensation for both the intrinsic offset $v_{off}$ of amplifier 102, and the mismatch $v_{off}$ between output buffer 104 and replica buffer 106.

In accordance with an embodiment, each switch S1, S2, S3, S4 and S5 may be implemented, for example, using one or more transistors, such as NMOS or PMOS transistors. In some embodiments, one or more of switches S1, S2, S3, S4 and S5 may be implemented using CMOS transmission gates, which are formed by coupling one or more NMOS transistors in parallel with one or more PMOS transistors. In such embodiments, the gate of the transistor acts as the control node of the switch, while the source-drain load path of the transistor acts as the switchable conductive path.

Amplifier 102 may be implemented using a combination of transistors arranged to form an operational amplifier (OPAMP), a transconductance amplifier, or other type of suitable amplifier. In some embodiments, amplifier 102 has a high dc gain in order to reduce steady-state dc error when amplifier 102 and output buffer are arranged in a closed-loop configuration. Output buffer 104 and replica buffer 106 may be implemented using unity gain buffer circuits known in the art, such as emitter follower circuits. In some embodiments, replica buffer 106 may be biased with a higher current than output buffer 104 in order to provide a higher drive strength to drive load 108. In some embodiments, load 108 may be a capacitive load, such as a capacitive array-based DAC as discussed herein.

Replica buffer 106 may use the same circuit topology as output buffer 104, and may use physically larger devices than output buffer 104. In some embodiments, output buffer 104 and replica buffer 106 are implemented using the same size unit devices, where replica buffer 106 includes a multiple of n unit devices with respect to output buffer 104 in order to enhance matching between output buffer 104 and replica buffer 106. In such embodiments, replica buffer 106 may be biased with a current that is a multiple of the same scaling factor n applied to the relative device sizes between output buffer 104 and replica buffer 106.

In various embodiments, during the second phase $\phi_2$ of operation, the closed loop bandwidth of amplifier 102 and output buffer 104 has a lower bandwidth than replica buffer 106. This advantageously permits the loop including amplifier 102 and output buffer 104 to provide accurate offset cancelation at the time that replica buffer provides a fast, high bandwidth reference voltage to load 108.

In various embodiments, the components of buffer circuit 100 may be disposed on a single monolithic semiconductor integrated circuit, such as a single semiconductor substrate, and/or on the same monolithic semiconductor integrated circuit as other disclosed system components. The semiconductor substrate may be a silicon substrate. Buffer circuit 100 may be fabricated using one of a variety of different semiconductor processes, such as a CMOS process, BiC-MOS process, Bipolar process, or other type of process.

Figure 2:
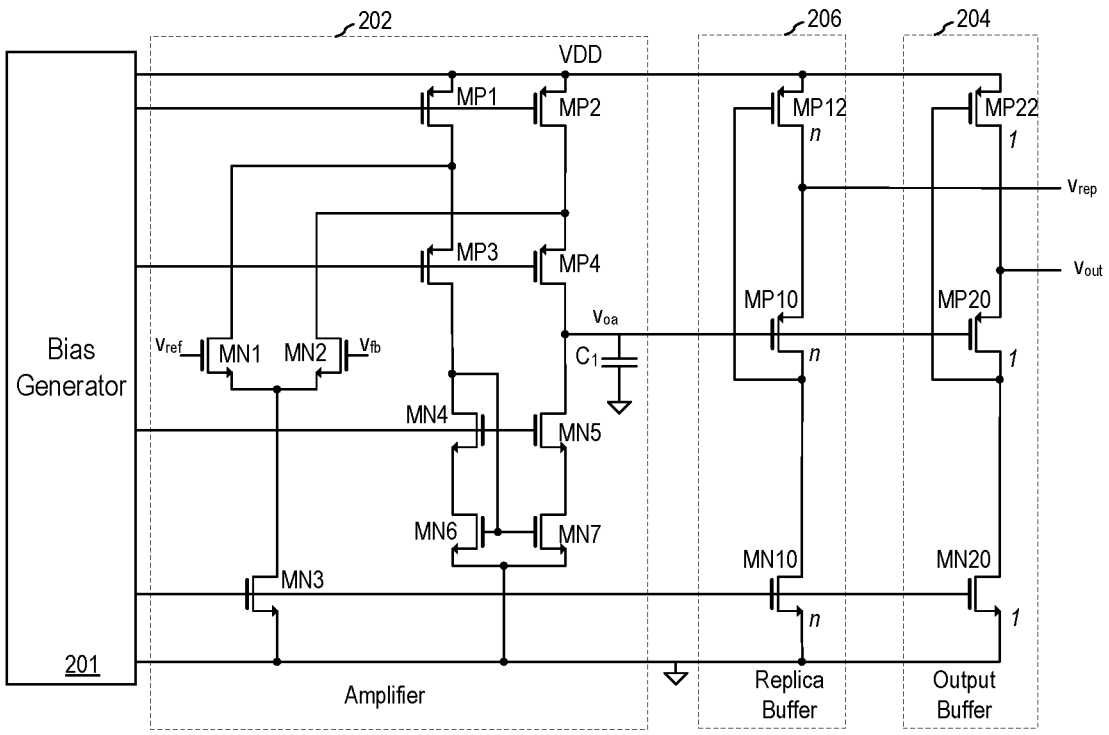
FIG. 2 illustrates a schematic of circuitry used to implement portions of the reference buffer circuit of FIG. 1.

FIG. 2 illustrates an example implementation of an amplifier 202, output buffer 204 and replica buffer 206 that could be used to respectively implement amplifier 102, output buffer 104 and replica buffer 106 shown in FIG. 1. Bias generator 201 is configured to provide bias voltages to amplifier 202, output buffer 204 and replica buffer 206.

As shown, amplifier 202 is implemented as a folded cascode transconductance amplifier whose input stage includes NMOS transistors MN1 and MN2 that form a differential input stage with a tail current provided by NMOS transistor MN3. The drains of transistors MN1 and MN2 are respectively connected to the drains of PMOS current source transistors MP1 and MP2, and respectively connected to the sources of PMOS cascode transistors MP3 and MP4. The output stage also includes a cascoded current mirror made of NMOS transistors MN4, MN5, MN6 and MN7, where NMOS transistors MN6 and MN7 form a current mirror, and MN4 and MN5 serve as cascode transistors. The bias currents provided by transistors MN3, MP1 and MP2, and the cascode bias voltage provided to transistors MP3, MP4, MN4 and MN5 may be set via bias generator 201 using standard bias generation circuits and techniques known in the art.

The output of amplifier 202 is taken from the drains of PMOS transistor MP4 and NMOS transistor MN5 and may be loaded with capacitor C1. In some embodiments, the closed loop bandwidth of amplifier 202 and output buffer 204 when connected in a feedback configuration is dependent on the capacitance of capacitor C1. The capacitance of capacitor C1 may be set, for example, to ensure an adequate phase margin according to circuit design practice known in the art.

It should be appreciated that the topology of amplifier 202 is just one example of a number of different ways amplifier 202 could be implemented. For example, in an alternative embodiment, NMOS cascode transistors MN4 and MN5 could be removed or a telescopic cascode structure could be used instead of a folded cascode structure. In some embodiments, the structure of amplifier 202 could be inverted such that a PMOS-based input stage is used instead of an NMOS-based input. In such an embodiment, the cascode output stage could be modified such that the output of the PMOS-based input stage is coupled to NMOS current source transistors and NMOS cascode transistors instead of PMOS current source transistors MP1 and MP2 and PMOS cascode transistors MP3 and MP4.

FIG. 2 shows output buffer 204 and replica buffer 206 as being implemented using flipped voltage follower (FVF) circuits, which is a type of source follower amplifier. For example, output buffer 204 includes a PMOS source follower transistor MP20 that is coupled to the output of amplifier 202. The drain of PMOS source follower transistor MP20 is connected to the drain of NMOS current source transistor MN20. The drains of transistors MP20 and MN20 are connected to the gate of PMOS transistor MP22 that supplies current to PMOS source follower transistor MP20, which forms a local feedback loop that keeps the current through PMOS source follower transistor MP10 substantially constant, thereby causing output buffer 204 to substantially have a unity gain.

Replica buffer 206 has the same circuit topology as output buffer 204 and includes PMOS source follower transistor MP10, current source transistor MN10 and PMOS transistor MP12 that supplies current to the source of PMOS source follower transistor MP10. As shown, each transistor of replica buffer 206 has an aspect ratio that is n times larger than the aspect ratio of each respective transistor in output buffer 204. In some embodiments, each transistor in output buffer 204 and replica buffer 206 use the same unit cells, such that replica buffer 206 uses n times the number of unit cells for each device than output buffer 204. This also causes the bias current of replica buffer 206 to be n times larger than the bias current of output buffer 204 since NMOS current source transistor MN10 of replica buffer 206 has an aspect ratio that is n times larger than the aspect ratio of NMOS current source transistor MN20 in output buffer 204. As shown, the gates of current source transistors MN10 and MN20 are connected to bias generator 201.

In alternative embodiments, output buffer 204 and replica buffer 206 may be implemented using other buffer or amplifier circuits known in the art. For example, output buffer 204 and replica buffer 206 may be implemented using simple source follower circuits instead of FVF circuits.

Figure 3A:
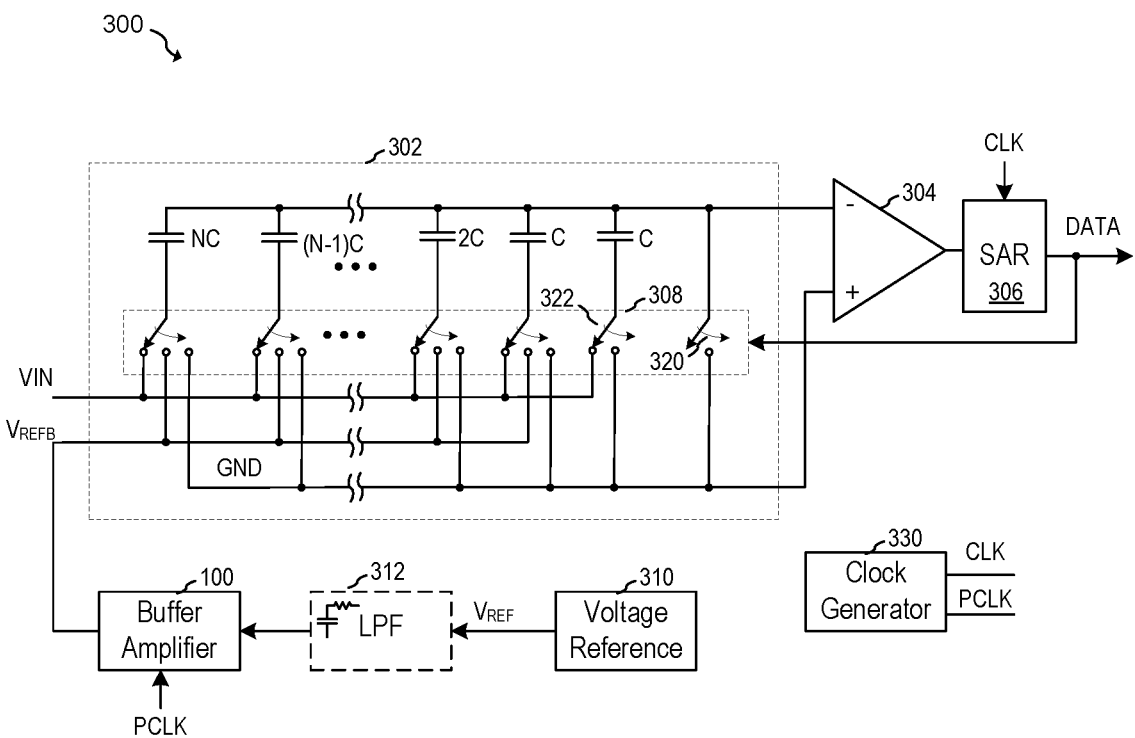
FIGS. 3A and 3B are schematics of a successive approximation analog-to-digital converter that includes the reference buffer circuit of FIG. 1.

The arrangement of these components may form a system designed to provide a stable reference voltage with reduced offset error for analog-to-digital converters. FIG. 3A illustrates an example successive approximation register analog-to-digital converter SAR-ADC 300 that utilizes a reference voltage buffer circuit 100 according to an embodiment. As shown, SAR ADC 300 includes a digital-to-analog converter (DAC) 302, a comparator 304, and a successive approximation register (SAR) 306. Buffer circuit 100, as described according to embodiments herein, provides a buffered reference voltage $V_{REFB}$ to DAC 302 based derived from reference voltage VREF provided by voltage reference circuit 310. For example, the output of replica buffer 106 of buffer circuit 100 shown in FIG. 1 may drive the capacitive array of DAC 302 during the second phase $\phi_2$ of operation. In some embodiments, a lowpass filter 312 may be coupled between voltage reference circuit 310 and buffer circuit 100 to filter noise and transients prior to buffering.

In various embodiments, voltage reference circuit 310 may be implemented, for example, using voltage reference circuits known in the art, such as a bandgap voltage generator. Lowpass filter 312 may be implemented, for example, using a simple passive RC filter. Alternative, lowpass filter 312 may be a higher order filter and/or an active filter.

As shown, DAC 302 is implemented as a capacitor array (also referred to as a capacitive array) DAC that includes a binary-weighted array of capacitors with capacitance values that are multiples of a base unit capacitor: C, 2C, 4C, . . . up to NC. The top plates of the capacitors of the capacitor array are coupled to the negative input of comparator 304, while the bottom plates of the capacitors are coupled to individual switches in switch array 308. The states of switch array is controlled by the DATA signal produced by SAR 306.

Operation of SAR ADC 300 may proceed according to known capacitor array-based SAR methods. For example, a sampling phase is initiated in which input voltage VIN is applied to the bottom plates of the capacitor array via switches of switch array 308 while the top plate of the capacitor array is grounded by closing switch 320. Next, SAR-ADC enters a successive approximation phase in which the contents of successive approximation register (SAR) 306 is initialized, for example, with all ones, switch 320 is opened, and the bottom plates of the capacitor array are selectively connected to node $V_{REFB}$ and node GND over a number of successive approximation cycles. For example, during a first cycle, switch 322 is closed, which connects the rightmost capacitor C to node GND, while the remaining switches of switch array 308 apply node $V_{REFB}$ to the bottom plates of the remaining capacitors. This causes the voltage of the top plates of the capacitor array to assume a voltage that represents the difference between an analog value representative of the digital value DATA and the input voltage VIN. Next, comparator 304 determines whether the voltage of the top plate of the capacitor is greater or less than ground voltage GND. Next, the most significant bit of SAR 306 is set to the output value of comparator 304, which causes a corresponding change to the switch states of switch array 308. This process continues successively through all bits from the MSB down to the least significant bit (LSB), effectively approximating the input voltage VIN. Each step refines the approximation until after N cycles (for an N-bit ADC), SAR 306 contains a digital code that corresponds to VIN within the resolution limits of the ADC. The operation of SAR ADC 300 may be synchronized by clock generator 330, control logic and/or a controller (not shown) that manages timing and control signals for switches and for data handling between DAC 302, comparator 304, and SAR 306.

It should be understood that the illustrated structure of DAC 302 is just one example of many possible structures that could be used to implement the function of DAC 302. In alternative embodiments, DAC 302 may be implemented using two capacitor arrays and/or may be operated in a differential manner. In some embodiments, a different voltage besides ground voltage may be applied to the bottom plates of the capacitor array and to comparator 304, for example, in order to facilitate operation with a single-ended power supply. In alternative embodiments, DAC 302 may be implemented using other DAC architectures known in the art including, but not limited to resistor-string DACs, R-2R ladder DACs, and current-steering DACs. In embodiments that do not perform bottom-plate sampling of input voltage VIN, SAR-ADC may include a separate sample-and-hold circuit to sample input voltage VIN and/or a subtraction circuit configured to form a difference between input voltage VIN and the analog output value of DAC 302.

In further alternative embodiments, buffer circuit 100 may be used to provide a reference voltage to a non-SAR ADC including, but not limited to, a flash ADC, a pipelined ADC, a sigma-delta ADC, and the like, as well as non-ADC circuits such as DACs, bias generators, and other types of analog circuits.

Figure 3B:
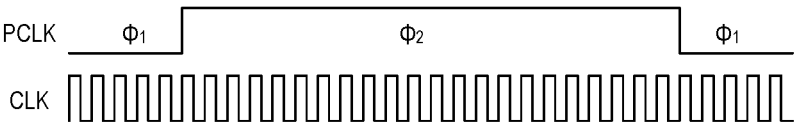

Clock generator 330 provides a low frequency clock signal PCLK for controlling the operation of embodiment buffer circuit 100, and a higher frequency clock signal CLK for clocking SAR 306, which controls the input of DAC 302 and digital output DATA. Representative clock signals PCLK and CLK are shown in the timing diagram of FIG. 3B. During first phase $\Phi_1$ of PCLK the offset of buffer amplifier is stored in a capacitor as described above with respect to FIG. 1. During the second phase $\Phi_2$ of PCLK, the replica buffer of buffer circuit 100 provides a low-offset buffered reference voltage $V_{REFB}$ to DAC 302. At the same time, DAC 302, comparator 304 and SAR 306 sample and successively approximate input voltage VIN according to the higher frequency clock signal CLK.

Figure 4:
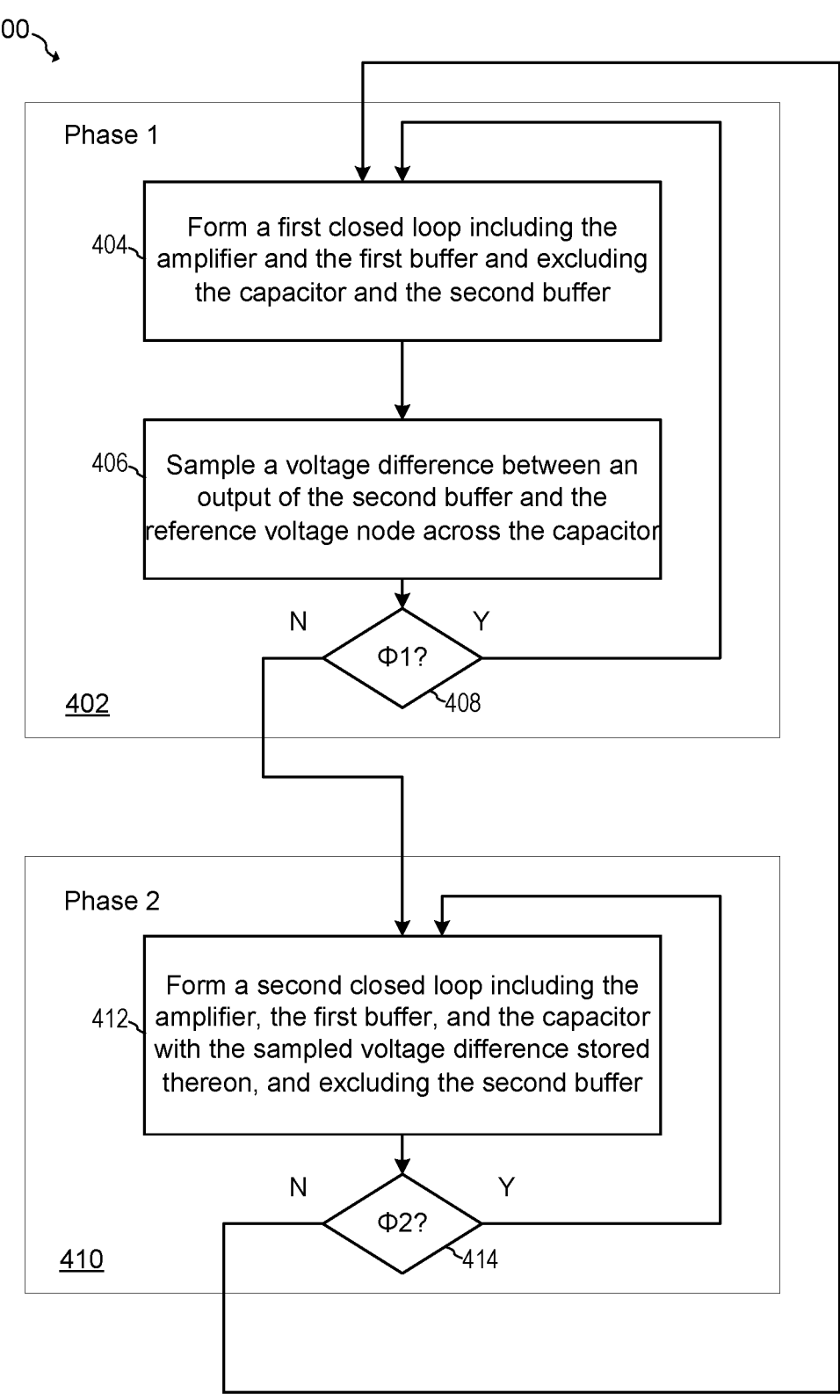
FIG. 4 is a block diagram of a method according to an embodiment.

FIG. 4 illustrates a method 400 of operating a circuit according to an embodiment. The circuit includes an amplifier having a first input coupled to a reference voltage node, a first buffer having an input coupled to an output of the amplifier, a second buffer having an input coupled to the output of the amplifier, and a capacitor. The circuit may be buffer circuit 100 shown in FIG. 1 and described above. The amplifier, first buffer and second buffer may respectively correspond, for example, to amplifier 102, output buffer 104, and replica buffer 106 as shown and described above with respect to FIG. 1. The capacitor may correspond to capacitor C shown in FIG. 1.

As shown, method 400 includes two phases of operation: phase 1 (step 402) and phase 2 (step 410). During the first phase (step 402), a first closed loop including the amplifier and the first buffer and excluding the capacitor and the second buffer is formed (step 404), and the voltage difference between an output of the second buffer and the reference voltage node across the capacitor is sampled by the capacitor (step 406). In some embodiments, this voltage difference represents the offset voltage that exists between the reference voltage node and the output of the second buffer. The first phase of operation may be implemented, for example, by closing switches S1, S2 and S3 and opening switches S4 and S5 as described above with respect to FIG. 1. Operation continues in phase 1 (step 402) as long as the phase signal @, is asserted (step 408).

During the second phase (step 410), a second closed loop including the amplifier, the first buffer, and the capacitor with the sampled voltage difference stored thereon, and excluding the second buffer is formed (step 412). This second phase of operation may be implemented, for example, by opening switches S1, S2 and S3 and closing switches S4 and S5 as described above with respect to FIG. 1. In the second phase of operation, a load may be driven using the output of the second buffer. Operation continues in phase 2 (step 410) as long as the phase signal $\Phi_2$ is asserted (step 414).

Embodiments of the present invention are summarized here. Other embodiments can also be understood from the entirety of the specification and the claims filed herein.

Example 1. A method of operating a circuit including an amplifier including a first input coupled to a reference voltage node, a first buffer having an input coupled to an output of the amplifier, a second buffer having an input coupled to the output of the amplifier, and a capacitor, the method includes: during a first phase of operation: forming a first closed loop including the amplifier and the first buffer and excluding the capacitor and the second buffer, and sampling a voltage difference between an output of the second buffer and the reference voltage node across the capacitor; and during a second phase of operation, forming a second closed loop including the amplifier, the first buffer, and the capacitor with the sampled voltage difference stored thereon, and excluding the second buffer.

Example 2. The method of example 1, where the output of the second buffer is coupled to a capacitive load.

Example 3. The method of example 1 or 2, where forming the first closed loop includes closing a first switch coupled between an output of the first buffer and a second input of the amplifier; sampling the voltage difference includes closing a second switch coupled between the reference voltage node and a first terminal of the capacitor, and closing a third switch coupled between the output of the second buffer and a second terminal of the capacitor; and forming the second closed loop includes closing a fourth switch coupled between the second input of the amplifier and the second terminal of the capacitor, and closing a fifth switch coupled between the output of the first buffer and the first terminal of the capacitor.

Example 4. The method of any one of examples 1 to 3, further including: opening the fourth switch and the fifth switch during the first phase of operation; and opening the first switch, the second switch and the third switch during the second phase of operation.

Example 5. The method of example 4, further including driving, by the output of the second buffer, a capacitive array of an analog-to-digital converter during the second phase of operation.

Example 6. The method of any one of examples 1 to 5, where, during the second phase of operation, the second closed loop has a lower bandwidth than the second buffer.

Example 7. A circuit, including: an amplifier including a first input coupled to a reference voltage node; a first buffer having an input coupled to an output of the amplifier; a second buffer having an input coupled to the output of the amplifier; a capacitor; and a controller configured to: during a first phase of operation: form a first closed loop including the amplifier and the first buffer and excluding the capacitor and the second buffer, and sample a voltage difference between an output of the second buffer and the reference voltage node across the capacitor; and during a second phase of operation, form a second closed loop including the amplifier, the first buffer, and the capacitor with the sampled voltage difference stored thereon, and excluding the second buffer.

Example 8. The circuit of example 7, further including: a first switch coupled between an output of the first buffer and a second input of the amplifier; a second switch coupled between the reference voltage node and a first terminal of the capacitor; a third switch coupled between the output of the second buffer and a second terminal of the capacitor; a fourth switch coupled between the second input of the amplifier and the second terminal of the capacitor; and a fifth switch coupled between the output of the first buffer and the first terminal of the amplifier.

Example 9. The circuit of example 8, where the controller is configured to: during the first phase of operation: close the first switch, the second switch and the third switch, and open the fourth switch and the fifth switch; and during the second phase of operation: open the first switch, the second switch and the third switch, and close the fourth switch and the fifth switch.

Example 10. The circuit of any one of examples 7 to 9, where the first input of the amplifier includes a positive input, and the second input of the amplifier includes a negative input.

Example 11. The circuit of any one of examples 7 to 10, where the first buffer is configured to be biased with a lower current than the second buffer.

Example 12. The circuit of any one of examples 7 to 11, where the first buffer includes a first source follower amplifier; and the second buffer includes a second source follower amplifier.

Example 13. The circuit of example 12, where the first source follower amplifier includes a first flipped voltage follower (FVF) circuit; and the second source follower amplifier includes a second FVF circuit.

Example 14. The circuit of any one of examples 7 to 13, where, during the second phase of operation, the second closed loop has a lower bandwidth than the second buffer.

Example 15. The circuit of any one of examples 7 to 14, where during the first phase of operation, an intrinsic offset voltage of the amplifier is stored on the capacitor; and during the second phase of operation, the intrinsic offset voltage stored on the capacitor is subtracted from a second input of the amplifier.

Example 16. A circuit including: an amplifier having a first input coupled to a reference voltage node and a second input; a first buffer having an input coupled to an output of the amplifier; a second buffer having an input coupled to the output of the amplifier; a capacitor; a first switch coupled between an output of the first buffer and the second input of the amplifier; a second switch coupled between the first input of the amplifier and a first terminal of the capacitor; a third switch coupled between an output of the second buffer and a second terminal of the capacitor; a fourth switch coupled between the second input of the amplifier and the second terminal of the capacitor; and a fifth switch coupled between the output of the first buffer and the first terminal of the amplifier.

Example 17. The circuit of example 16, further including a controller coupled to control nodes of the first switch, the second switch, the third switch, the fourth switch and the fifth switch, the controller configured to: during a first phase of operation: activate the first switch, the second switch and the third switch, and deactivate the fourth switch and the fifth switch; and during a second phase of operation: deactivate the first switch, the second switch and the third switch, and activate the fourth switch and the fifth switch.

Example 18. The circuit of example 16 or 17, where the amplifier includes a folded cascode transconductance amplifier; the first buffer includes a first source follower amplifier; and the second buffer includes a second source follower amplifier.

Example 19. The circuit of example 18, where the first source follower amplifier includes a first flipped voltage follower (FVF) circuit; and the second source follower amplifier includes a second FVF circuit.

Example 20. The circuit of example 18 or 19, where the second buffer is configured to have a higher bias current than the first buffer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a circuit comprising an amplifier comprising a first input coupled to a reference voltage node, a first buffer having an input coupled to an output of the amplifier, a second buffer having an input coupled to the output of the amplifier, and a capacitor, the method comprising: during a first phase of operation: forming a first closed loop including the amplifier and the first buffer and excluding the capacitor and the second buffer, wherein the first buffer provides a first analog voltage to a second input of the amplifier, and sampling, by the capacitor, a voltage difference between an output of the second buffer and the reference voltage node, and during a second phase of operation, forming a second closed loop including the amplifier, the first buffer, and the capacitor with the sampled voltage difference stored thereon, and excluding the second buffer, wherein the first buffer provides a second analog voltage to the second input of the amplifier during the second phase of operation, wherein the second buffer operates in an open loop condition during the second phase of operation.

2. The method of claim 1, wherein the output of the second buffer is coupled to a capacitive load.

3. The method of claim 1, wherein:
forming the first closed loop comprises closing a first switch coupled between the output of the first buffer and the second input of the amplifier;
sampling the voltage difference comprises closing a second switch coupled between the reference voltage node and a first terminal of the capacitor, and closing a third switch coupled between the output of the second buffer and a second terminal of the capacitor; and
forming the second closed loop comprises closing a fourth switch coupled between the second input of the amplifier and the second terminal of the capacitor, and closing a fifth switch coupled between the output of the first buffer and the first terminal of the capacitor.

4. The method of claim 3, further comprising:
opening the fourth switch and the fifth switch during the first phase of operation; and
opening the first switch, the second switch and the third switch during the second phase of operation.

5. The method of claim 1, further comprising driving, by the output of the second buffer, a capacitive array of an analog-to-digital converter during the second phase of operation.

6. The method of claim 1, wherein, during the second phase of operation, the second closed loop has a lower bandwidth than the second buffer.

7. A circuit, comprising: an amplifier comprising a first input coupled to a reference voltage node; a first buffer having an input coupled to an output of the amplifier; a second buffer having an input coupled to the output of the amplifier; a capacitor; and a controller configured to: during a first phase of operation: form a first closed loop including the amplifier and the first buffer and excluding the capacitor and the second buffer, wherein the first buffer is configured to provide a first analog voltage to a second input of the amplifier, cause the capacitor to sample a voltage difference between an output of the second buffer and the reference voltage node; and during a second phase of operation, form a second closed loop including the amplifier, the first buffer, and the capacitor with the sampled voltage difference stored thereon, and excluding the second buffer, wherein the first buffer is configured to provide a second analog voltage to the second input of the amplifier during the second phase of operation, wherein the second buffer operates in an open loop condition during the second phase of operation.

8. The circuit of claim 7, further comprising:
a first switch coupled between the output of the first buffer and the second input of the amplifier;
a second switch coupled between the reference voltage node and a first terminal of the capacitor;
a third switch coupled between the output of the second buffer and a second terminal of the capacitor;
a fourth switch coupled between the second input of the amplifier and the second terminal of the capacitor; and
a fifth switch coupled between the output of the first buffer and the first terminal of the capacitor.

9. The circuit of claim 8, wherein the controller is configured to:
during the first phase of operation:
close the first switch, the second switch and the third switch, and
open the fourth switch and the fifth switch; and
during the second phase of operation:
open the first switch, the second switch and the third switch, and
close the fourth switch and the fifth switch.

10. The circuit of claim 8, wherein the first input of the amplifier comprises a positive input, and the second input of the amplifier comprises a negative input.

11. The circuit of claim 7, wherein the first buffer is configured to be biased with a lower current than the second buffer.

12. The circuit of claim 7, wherein:
the first buffer comprises a first source follower amplifier; and
the second buffer comprises a second source follower amplifier.

13. The circuit of claim 12, wherein:
the first source follower amplifier comprises a first flipped voltage follower (FVF) circuit; and
the second source follower amplifier comprises a second FVF circuit.

14. The circuit of claim 7, wherein, during the second phase of operation, the second closed loop has a lower bandwidth than the second buffer.

15. The circuit of claim 7, wherein:
during the first phase of operation, an intrinsic offset voltage of the amplifier is stored on the capacitor; and
during the second phase of operation, the intrinsic offset voltage stored on the capacitor is subtracted from the second input of the amplifier.

16. A circuit comprising:
an amplifier having a first input coupled to a reference voltage node and a second input;
a first buffer having an input coupled to an output of the amplifier;
a second buffer having an input coupled to the output of the amplifier;
a capacitor;
a first switch coupled between an output of the first buffer and the second input of the amplifier;
a second switch coupled between the first input of the amplifier and a first terminal of the capacitor;
a third switch coupled between an output of the second buffer and a second terminal of the capacitor;

a fourth switch coupled between the second input of the amplifier and the second terminal of the capacitor; and a fifth switch coupled between the output of the first buffer and the first terminal of the capacitor.

17. The circuit of claim 16, further comprising a controller coupled to control nodes of the first switch, the second switch, the third switch, the fourth switch and the fifth switch, the controller configured to:

during a first phase of operation:

activate the first switch, the second switch and the third switch, and deactivate the fourth switch and the fifth switch; and during a second phase of operation:

deactivate the first switch, the second switch and the third switch, and activate the fourth switch and the fifth switch.

18. The circuit of claim 16, wherein:

the amplifier comprises a folded cascode transconductance amplifier;

the first buffer comprises a first source follower amplifier; and the second buffer comprises a second source follower amplifier.

19. The circuit of claim 18, wherein:

the first source follower amplifier comprises a first flipped voltage follower (FVF) circuit; and the second source follower amplifier comprises a second FVF circuit.

20. The circuit of claim 16, wherein the second buffer is configured to have a higher bias current than the first buffer.

* * * * *